US010380947B2

(12) United States Patent
Fujii et al.

(10) Patent No.: US 10,380,947 B2
(45) Date of Patent: Aug. 13, 2019

(54) ORGANIC LIGHT-EMITTING DISPLAY DEVICE AND METHOD OF DRIVING THE SAME

(71) Applicant: Samsung Display Co., Ltd., Yongin-si, Gyeonggi-do (KR)

(72) Inventors: Mitsuru Fujii, Asan-si (KR); In Soo Wang, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 86 days.

(21) Appl. No.: 15/802,296

(22) Filed: Nov. 2, 2017

(65) Prior Publication Data
US 2018/0330665 A1 Nov. 15, 2018

(30) Foreign Application Priority Data

May 12, 2017 (KR) ........................ 10-2017-0059355

(51) Int. Cl.
G09G 3/3258 (2016.01)
H01L 27/32 (2006.01)
H01L 51/52 (2006.01)
G09G 3/3291 (2016.01)

(52) U.S. Cl.
CPC ......... *G09G 3/3258* (2013.01); *G09G 3/3291* (2013.01); *H01L 27/3262* (2013.01); *H01L 27/3276* (2013.01); *H01L 51/5262* (2013.01); *G09G 2310/0243* (2013.01); *G09G 2310/0264* (2013.01)

(58) Field of Classification Search
USPC ........................................................ 345/204
See application file for complete search history.

(56) References Cited

U.S. PATENT DOCUMENTS

2003/0122759 A1* 7/2003 Abe .................. G09G 3/22
345/89
2004/0051684 A1* 3/2004 Ishizuka .............. G09G 3/3233
345/76
2008/0012811 A1* 1/2008 Sung .................... G09G 3/3291
345/89

(Continued)

FOREIGN PATENT DOCUMENTS

KR 10-2011-0063021 6/2011
KR 10-2016-0071265 6/2016
KR 10-2016-0099760 8/2016

*Primary Examiner* — Chineyere D Wills-Burns
(74) *Attorney, Agent, or Firm* — Lewis Roca Rothgerber Christie LLP

(57) ABSTRACT

A display including first to n-th pixels electrically connected with a first data line, and a data compensator for generating a reference voltage of a k-th pixel (k being between 1 and n) based on a first coupling voltage between the k-th pixel and the first data line and a second coupling voltage between the k-th pixel and a second data line, and comparing an average voltage generated based on a reference voltage of at least one of the first to n-th pixels with the reference voltage of the k-th pixel to generate a compensation signal, wherein the reference voltage of at least one of the first to n-th pixels is based on a coupling voltage between the at least one of the first to n-th pixels and the first data line and based on a coupling voltage between the pixels and the second data line.

20 Claims, 12 Drawing Sheets

(56) References Cited

U.S. PATENT DOCUMENTS

| | | | |
|---|---|---|---|
| 2011/0279436 A1* | 11/2011 | Komiya | G09G 3/3233 |
| | | | 345/212 |
| 2014/0139510 A1* | 5/2014 | Han | G09G 3/3233 |
| | | | 345/212 |
| 2015/0102312 A1* | 4/2015 | Lee | G09G 3/3233 |
| | | | 257/40 |
| 2016/0086546 A1* | 3/2016 | Noh | G09G 3/3258 |
| | | | 345/80 |
| 2016/0117982 A1* | 4/2016 | Fujii | G09G 3/3225 |
| | | | 345/211 |
| 2016/0240128 A1* | 8/2016 | Kim | G09G 3/2007 |
| 2017/0092178 A1* | 3/2017 | Lee | H01L 27/1225 |
| 2017/0193914 A1* | 7/2017 | Heo | G09G 3/3611 |

* cited by examiner

ORGANIC LIGHT-EMITTING DISPLAY DEVICE AND METHOD OF DRIVING THE SAME

CROSS-REFERENCE TO RELATED APPLICATION

This application claims priority to, and the benefit of, Korean Patent Application No. 10-2017-0059355, filed on May 12, 2017, which is hereby incorporated by reference for all purposes as if fully set forth herein.

BACKGROUND

1. Field

Embodiments of the present invention relate to an organic light-emitting display device, and a method of driving the same.

2. Description of the Related Art

The importance of a display device has increased with the development of multimedia. Various types of display devices, such as a liquid crystal display (LCD), an organic light-emitting display (OLED), and the like, have been used in response to this increasing importance.

Among display devices, an organic light-emitting display device displays an image by using organic light emitting elements that generate light by recombination of electrons and holes. The organic light-emitting display device is advantageous in that it has a rapid response speed, high luminance, and a wide viewing angle, and is driven at low power consumption.

SUMMARY

An aspect of embodiments of the present invention provides an organic light-emitting display device that can compensate for a luminance difference due to vertical crosstalk.

Another aspect of embodiments of the present invention provides a method of driving an organic light-emitting display device that can compensate for a luminance difference due to vertical crosstalk.

An embodiment of the present invention discloses an organic light-emitting display including a plurality of pixels including first to n-th pixels (n is a natural number of 2 or more) electrically connected with a first data line extending in a second direction, and a data compensator for generating a reference voltage of a k-th pixel of the pixels (k being a natural number of 1 or more, and of n or less) based on a first coupling voltage between the k-th pixel and the first data line and based on a second coupling voltage between the k-th pixel and a second data line adjacent to the first data line in a first direction crossing the second direction, and comparing an average voltage generated based on a reference voltage of at least one of the first to n-th pixels with the reference voltage of the k-th pixel to generate a compensation signal, wherein the reference voltage of at least one of the first to n-th pixels is generated based on a coupling voltage between the at least one of the first to n-th pixels and the first data line and based on a coupling voltage between the at least one of the first to n-th pixels and the second data line.

The data compensator may also be for determining a voltage level of the compensation signal based on a voltage difference between the reference voltage of the k-th pixel and the average voltage.

The data compensator may also be for generating the average voltage by dividing an accumulated voltage obtained by adding reference voltages of the first to n-th pixels by n.

The data compensator may be for generating the compensation signal based on a reference voltage of a pixel displaying a first color among the plurality of pixels, and the data compensator may be for using the compensation signal for a pixel displaying a second color that is different from the first color.

The data compensator may be for generating the average voltage by dividing an accumulated voltage obtained by adding reference voltages of odd-numbered or even-numbered pixels among the first to n-th pixels by a number of the added reference voltages.

The data compensator may include a gradation data converter for receiving a first video signal including first gradation data provided to the k-th pixel, and second gradation data provided to a pixel of the pixels that is adjacent to the k-th pixel in the first direction, converting the first gradation data into a first gradation data voltage, and converting the second gradation data into a second gradation data voltage, a coupling operator for generating the reference voltage of the k-th pixel based on the first and second gradation data voltages and based on a ratio of the first and second coupling voltages, and an accumulative operator for generating the average voltage based on the reference voltage of at least one pixel among the first to n-th pixels.

The accumulative operator may be for adding the reference voltage of the k-th pixel to an accumulated voltage obtained by adding reference voltages of the first pixel to a (k−1)-th pixel.

The accumulative operator may include a memory for storing reference voltages of the first pixel to a (k−1)-th pixel.

The memory may be for storing an average voltage in a first frame, an average voltage in a second frame subsequent to the first frame, and an accumulated voltage obtained by adding the reference voltages of the first pixel to the (k−1)-th pixel in a third frame subsequent to the second frame.

The data compensator may include a motion operator for comparing the average voltage in the first frame with the average voltage in the second frame.

The motion operator may be for generating an average voltage in the third frame based on the average voltage in the second frame and the accumulated voltage.

An embodiment of the present invention discloses an organic light-emitting display device, including a plurality of pixels including a first pixel electrically connected with a first data line, and a second pixel electrically connected with a second data line that is adjacent to the first data line in a first direction, and a data compensator for generating a reference voltage of the first pixel based on a first coupling voltage between the first pixel and the first data line, generating a second coupling voltage between the first pixel and the second data line, and comparing an average voltage generated based on a reference voltage of at least one pixel of the pixels electrically connected with the first data line with the reference voltage of the first pixel to generate a compensation signal.

The data compensator may be for determining a voltage level of the compensation signal based on a voltage difference between the reference voltage of the first pixel and the average voltage.

The data compensator may include a gradation data converter for receiving a first video signal including first gradation data provided to the first pixel, and second gradation data provided to the second pixel, converting the first gradation data into a first gradation data voltage, and converting the second gradation data into a second gradation data voltage, a coupling operator for generating the reference voltage of the first pixel based on the first and second gradation data voltages and based on a ratio of the first and second coupling voltages, and an accumulative operator for generating the average voltage based on an accumulated voltage obtained by adding reference voltages of one or more pixels.

The accumulative operator may include a memory for storing the average voltage.

In embodiment of the present invention discloses a method of driving an organic light-emitting display device including a plurality of pixels including first to n-th pixels (n being a natural number of 2 or more) that are electrically connected with a first data line, the method including generating a reference voltage of a k-th pixel (k being a natural number of 1 or more and n or less) among the first to n-th pixels based on a first coupling voltage between the k-th pixel and the first data line, and based on a second coupling voltage between the k-th pixel and a second data line that is adjacent to the first data line in a second direction, generating an average voltage based on a first accumulated voltage obtained by adding the reference voltages of the first pixel to the k-th pixel, and generating a compensation signal by comparing the reference voltage of the k-th pixel with the average voltage.

A voltage level of the compensation signal may be set based on a voltage difference between the reference voltage of the k-th pixel and the average voltage.

The step of generating the average voltage may include adding the reference voltage of the k-th pixel to the first accumulated voltage to generate a second accumulated voltage, adding reference voltages of the (k+1)-th pixel to the n-th pixel to the second accumulated voltage to generate a third accumulated voltage, and dividing the third accumulated voltage by n to generate the average voltage.

Generating the reference voltage of the k-th pixel may include receiving a first video signal including first gradation data provided to the k-th pixel, and second gradation data provided to a pixel adjacent to the k-th pixel in the second direction among the plurality of pixels, converting the first gradation data into a first gradation data voltage, converting the second gradation data into a second gradation data voltage, and generating the reference voltage of the k-th pixel based on the first and second gradation data voltages and based on a ratio of the first and second coupling voltages.

The method may further include storing the generated average voltage in a memory.

However, aspects of the present invention are not restricted to the embodiments set forth herein. The above and other aspects will become more apparent to one of ordinary skill in the art to which embodiments of the present invention pertains by referencing the detailed description given below.

BRIEF DESCRIPTION OF THE DRAWINGS

The above and other aspects and features of embodiments of the present invention will become more apparent by describing in detail embodiments with reference to the attached drawings, in which.

DETAILED DESCRIPTION

Figure 1:
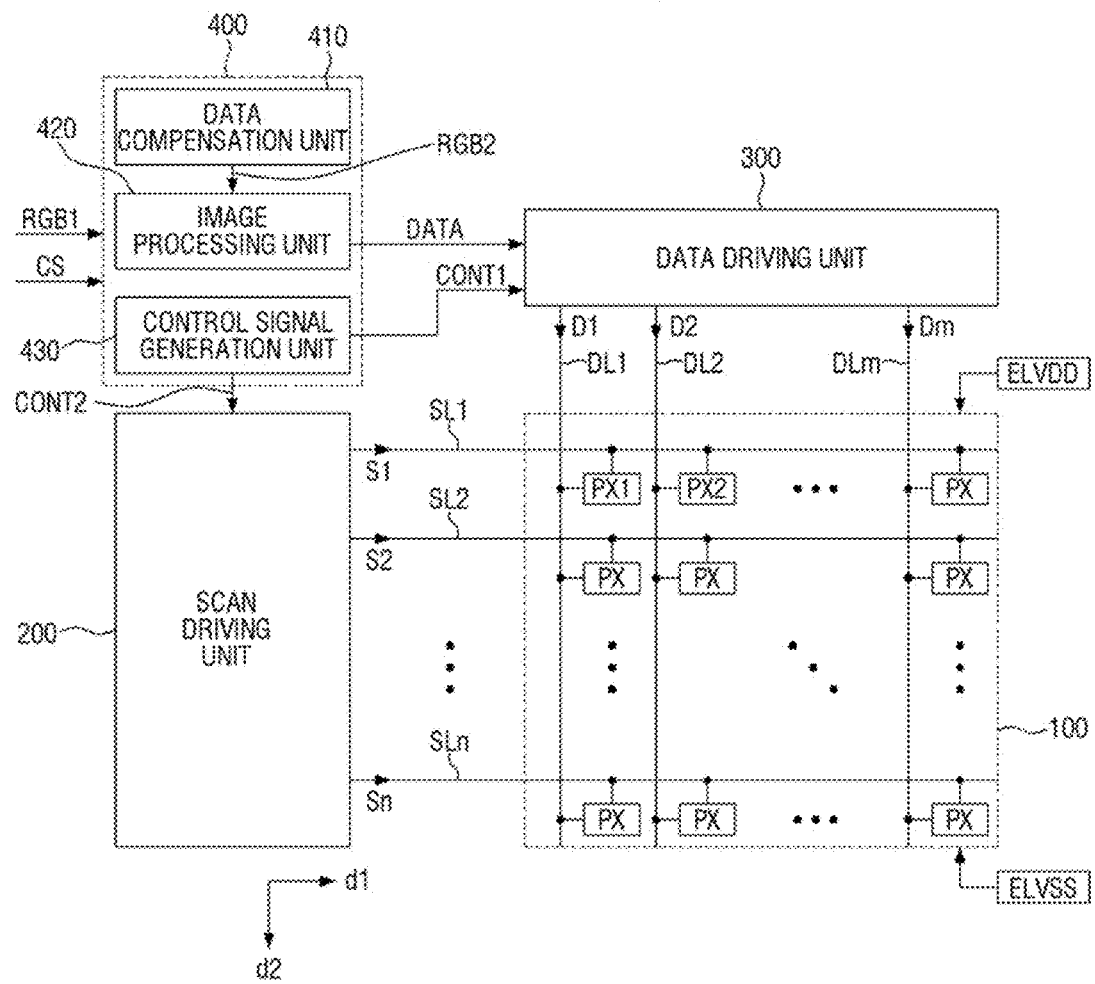
FIG. 1 is a schematic block diagram of an organic light-emitting display device according to an embodiment of the present invention.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic block diagram of an organic light-emitting display device according to an embodiment of the present invention.

Referring to FIG. 1, an organic light-emitting display device according to an embodiment of the present invention may include a display unit 100, a scan driver (scan driving unit) 200, a data driver (data driving unit) 300, and a timing controller (timing control unit) 400.

The display unit 100 is an area for displaying an image. The display unit 100 may be provided with a plurality of pixels (pixel units) PX including a first pixel PX1 and a second pixel PX2. The plurality of pixels PX may be electrically connected with first to n-th scan lines SL1 to SLn (n being a natural number of 1 or more) extending in a first direction d1. Further, the plurality of pixels PX may be electrically connected with first to m-th data lines DL1 to DLm (m being a natural number of 1 or more) extending in a second direction d2. Here, the first direction d1 may cross the second direction d2. Referring to FIG. 1, the first direction d1 is exemplified as a row direction, and the second direction d2 is exemplified as a column direction. That is, the plurality of pixels PX may be arranged in pixel regions defined by the first to n-th scan lines SL1 to SLn and the first to m-th data lines DL1 to DLm, respectively.

The scan driver 200 may be connected with the plurality of pixels PX through the first to n-th scan lines SL1 to SLn. For example, the scan driver 200 may generate first to n-th scan signals S1 to Sn, and may provide the generated first to n-th scan signals S1 to Sn to the plurality of pixels PX through the first to n-th scan lines SL1 to SLn, respectively. The scan driver 200 may generate the first to n-th scan signals S1 to Sn based on a second control signal CONT2 received from the timing controller 400. The scan driver 200 may include a plurality of transistors generating the first to n-th scan signals S1 to Sn. However, the present invention is not limited thereto, and the scan driver 200 may include an integrated circuit generating the first to n-th scan signals S1 to Sn.

The data driver 300 may be connected with the plurality of pixels PX through the first to m-th data lines DL1 to DLm. For example, the data driver 300 may generate the first to m-th data signals D1 to Dm, and may provide the generated first to m-th data signals D1 to Dm to the plurality of pixels PX through the first to m-th data lines DL1 to DLm, respectively. The data driver 300 may include a shift register, a latch, a digital-analog converter, and the like.

The data driver 300 may receive a first control signal CONT1 and image data DATA from the timing controller 400. The data driver 300 may convert image data DATA of a digital waveform into the first to m-th data signals D1 to Dm of an analog form based on the first control signal CONT1. The data driver 300 may provide the first to m-th data signals D1 to Dm to pixels selected from the plurality of pixels PX according to the first to n-th scan signals S1 to Sn.

The timing controller 400 may receive a first image signal RGB1 and a control signal CS from the outside. The first image signal RGB1 may include gradation data corresponding to data signals to be provided to the plurality of pixels PX. The control signal CS may include a vertical synchronization signal Vsync (refer to FIG. 10), a horizontal synchronization signal, a main clock signal, and a data enable signal. The timing controller 400 may processes the signals received from the outside in accordance with the operating conditions of the display unit 110, and may then generate the image data DATA, the first control signal CONT1, and the second control signal CONT2.

For example, the timing controller 400 may include a data compensator (data compensation unit) 410, an image processor (image processing unit) 420, and a control signal generator (control signal generation unit) 430.

The data compensator 410 may receive the first image signal RGB1, and may compensate for a coupling voltage, which may be caused by parasitic capacitors between the plurality of pixels PX and the first to m-th data lines DL1 to DLm, to generate a second image signal RGB2. The data compensator 410 may provide the generated second image signal RGB2 to the image processor 420. The data compensator 410 will be described later with reference to FIG. 5.

The image processor 420 may generate image data DATA by performing signal processing for the second image signal RGB2 received from the data compensator 410 in accordance with the operating condition of the display unit 110. The image processor 420 may provide the generated image data DATA to the data driver 300.

The control signal generator 430 may generate the first control signal CONT1 and the second control signal CONT2 based on an externally provided control signal CS. The control signal generator 430 may provide the generated first control signal CONT1 to the data driver 300. The first control signal CONT1 may include a horizontal synchronization start signal for instructing the start of input of the image data DATA, and a load signal for controlling the application of the first to m-th data signals D1 to Dm. In addition, the control signal generator 430 may provide the generated second control signal CONT2 to the scan driver 200. The second control signal CONT2 may include a scan start signal for instructing the start of output of first to n-th gate signals G1 to Gn, and a gate clock signal for controlling the output timing of a scan-on pulse.

Meanwhile, the organic light-emitting display device may further include a power supply unit. The power supply unit may provide a first driving voltage ELVDD and a second driving voltage ELVSS to the plurality of pixels PX. The first driving voltage ELVDD may be higher than the second driving voltage ELVSS.

Hereinafter, the plurality of pixels PX will be described in more detail with reference to the first pixel PX1.

Figure 2:
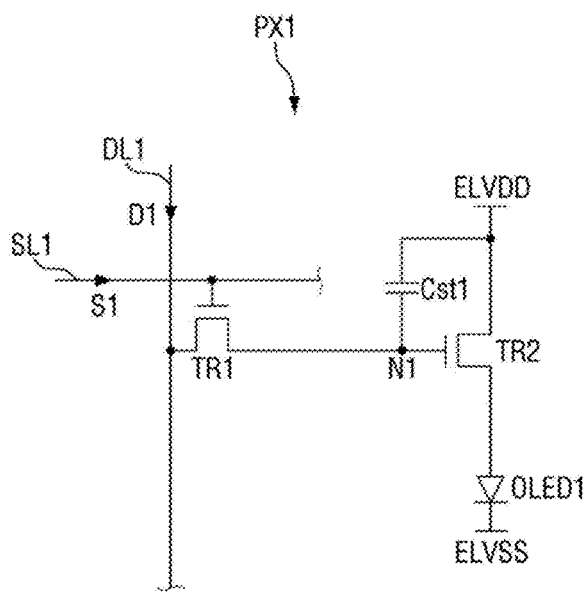
FIG. 2 is an equivalent circuit diagram showing an embodiment of a first pixel unit in the configuration of the organic light-emitting display device shown in FIG. 1.

FIG. 2 is an equivalent circuit diagram showing an embodiment of the first pixel unit in the configuration of the organic light-emitting display device shown in FIG. 1.

Referring to FIG. 2, the first pixel PX1 may be electrically connected to the first scan line SL1 and the first data line DL1. The first pixel PX1 may include a first switching element TR1, a second switching element TR2, a first capacitor Cst1, and a first organic light-emitting element OLED1.

The first switching element TR1 may include one electrode electrically connected with the first data line DL1, the other electrode electrically connected with a first node N1, and a control electrode electrically connected with the first scan line SL1. Here, the first node N1 may be electrically connected with the control electrode of the second switching element TR2 and one electrode of the first capacitor Cst1, which will be described later. The first switching element TR1 may be turned on according to the first scan signal S1 received from the first scan line SL1 to provide the first data signal D1 received from the first data line DL1 to the first node N1.

The first capacitor Cst1 may include one end electrically connected with the first node N1, and another end for receiving the first drive voltage ELVDD. The first capacitor Cst1 may charge a voltage corresponding to a voltage level difference between the voltage provided to the first node N1 and the first driving voltage ELVDD.

The second switching element TR2 may include one electrode for receiving the first driving voltage ELVDD, another electrode electrically connected to one end of the first organic light-emitting diode OLED1, and a control electrode electrically connected with the first node N1. Accordingly, the second switching element TR2 can adjust the driving current provided to the first organic light-emitting diode OLED1 based on the voltage supplied to the control electrode.

The first organic light-emitting diode OLED1 may emit light (e.g., light having a predetermined color) based on the driving current. Here, the color may be one of red, green, and blue. The first organic light-emitting diode OLED1 may include a low molecular or high molecular organic material corresponding to the color of emitted light. Meanwhile, in another embodiment, the first organic light-emitting diode OLED1 may emit white light. When the first organic light-emitting diode OLED1 emits white light, the first organic light-emitting diode OLED1 may be a laminate of red, green, and blue light-emitting layers.

Meanwhile, the first pixel PX1 is not limited to that shown in FIG. 2. In another embodiment, the first pixel PX1 may further include a plurality of switching elements for compensating for a threshold voltage of the second switching element TR2, in addition to the first switching element TR1 and the second switching element TR2.

The first switching element TR1 and the second switching element TR2 may be P-type thin film transistors. In another embodiment, the first switching element TR1 and the second switching element TR2 may be N-type thin film transistors, or may be different from each other (e.g., a P-type thin film transistor, and an N-type thin film transistor).

Figure 3:
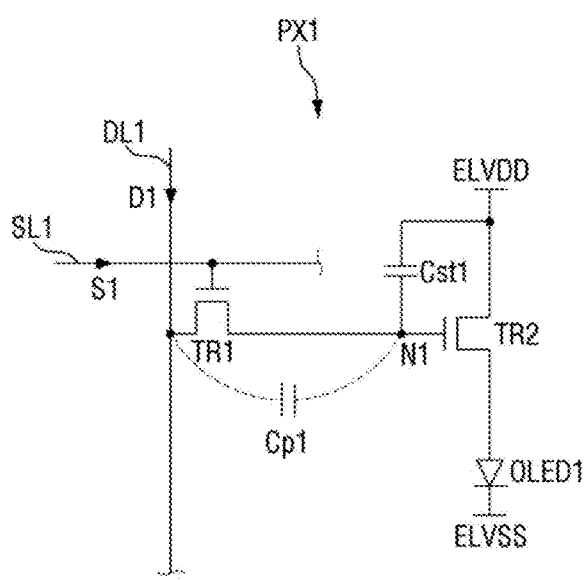
FIG. 3 is an equivalent circuit diagram for explaining the coupling that may occur in the first pixel unit shown in FIG. 2.

FIG. 3 is an equivalent circuit diagram for explaining the coupling that may occur in the first pixel unit shown in FIG. 2.

Referring to FIG. 3, coupling may be generated by a first parasitic capacitor Cp1 between the first node N1 and the first data line DL1. For example, the first parasitic capacitor Cp1 may be formed between the control electrode of the second switching element TR2 and the first data line DL1. The potential of the data signal supplied to the second switching element TR2 may be changed by the first parasitic capacitor Cp1. In particular, the potential of the control electrode of the second switching element TR2 may be varied by being influenced by the potential change of the data signal during the light emission of the first organic light-emitting diode OLED1. Thus, vertical crosstalk may be generated. Meanwhile, the "first" in the first parasitic capacitor Cp1 is for distinguishing from a second parasitic capacitor Cp2 (refer to FIG. 4) and a third parasitic capacitor Cp3 (refer to FIG. 4), which will described later.

The vertical crosstalk may also be influenced by coupling with adjacent data lines. Hereinafter, details thereof will be described with reference to FIG. 4.

Figure 4:
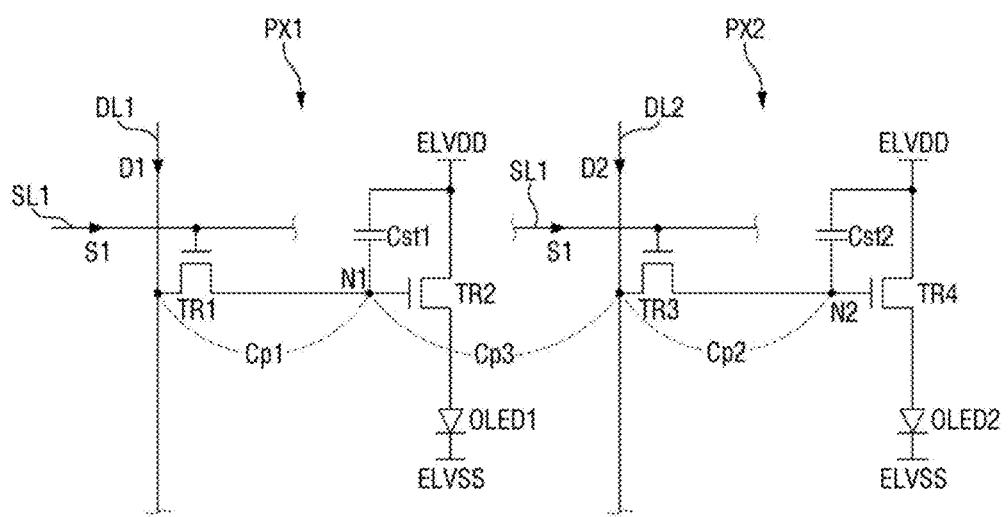
FIG. 4 is an equivalent circuit diagram for explaining the coupling that may occur between data lines adjacent to the first pixel unit shown in FIG. 2.

FIG. 4 is an equivalent circuit diagram for explaining the coupling that may occur between data lines adjacent to the first pixel unit shown in FIG. 2. However, a description overlapping those having been described in FIGS. 1 to 3 will be omitted. Further, the first pixel PX1 and the second pixel PX2 illustrated in FIG. 1 will be described as an example.

Referring to FIG. 4, the first pixel PX1 may be adjacent to the second pixel PX2. For example, the first pixel PX1 may be adjacent to the second pixel PX2 based on the second data line DL2. In the present specification, the expression that "first and second components are adjacent to each other" means that the first component and the second component are adjacent to each other, but a third component, which is the same as the first component or the second component, is not between the first component and the second component.

The second pixel PX2 may include a third switching element TR3, a fourth switching element TR4, a second capacitor Cst2, and a second organic light-emitting diode OLED2. As described above with reference to FIG. 3, in the case of the second pixel PX2, a second parasitic capacitor Cp2 may be formed between the second data line DL2 and the control electrode of the fourth switching element TR4.

Furthermore, a third parasitic capacitor Cp3 may be formed between the first node N1, that is, the control electrode of the second switching element TR2, and the second data line DL2. Thus, in the control electrode of the second switching element TR2, both coupling by the first parasitic capacitor Cp1 and coupling by the third capacitor Cp3 may occur.

That is, the organic light-emitting display device according to an embodiment of the present invention may generate the first compensation voltage V_DIFF1 (e.g., V_DIFF of FIG. 5) based on the first pixel PX1, in consideration of not only the coupling between the first data line DL1 and the control electrode of the second switching element TR2, but also the coupling between the second data line DL2 and the control electrode of the second switching element TR2. Hereinafter, a method of generating the first compensation voltage V_DIFF1 will be described in detail with reference to FIG. 5.

Figure 5:
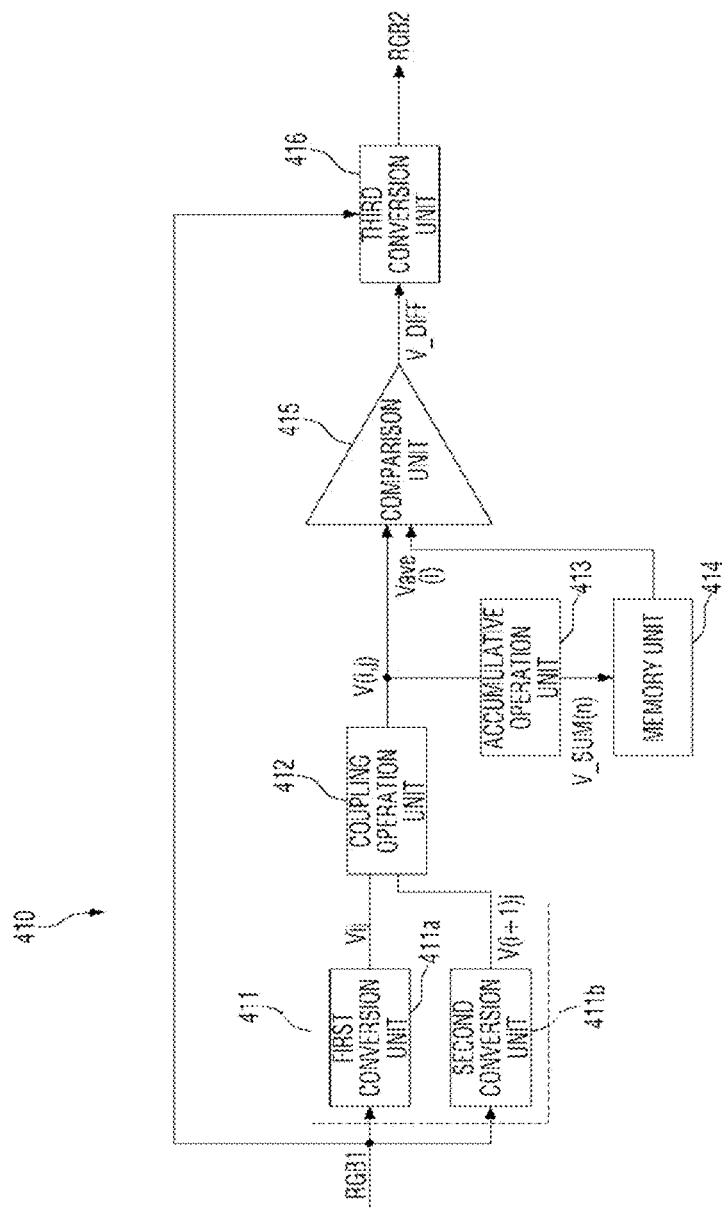
FIG. 5 is a block diagram schematically showing an embodiment of the data compensator shown in FIG. 1.
Figure 6:
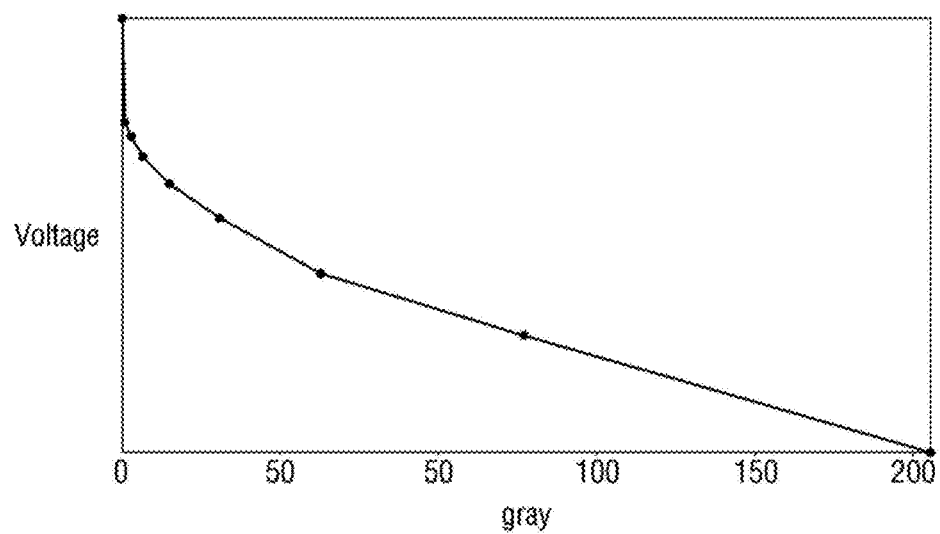
FIG. 6 is a graph showing a relationship between gradation data and gradation data voltage in the organic light-emitting display device according to an embodiment of the present invention.

FIG. 5 is a block diagram schematically showing an embodiment of the data compensator shown in FIG. 1. FIG. 6 is a graph showing a relationship between gradation data (gray) and gradation data voltage (Voltage) in the organic light-emitting display device according to an embodiment of the present invention. Hereinafter, details will be described based on the first pixel PX1 shown in FIG. 1.

First, referring to FIGS. 1 and 5, the data compensator 410 includes a gradation data converter (gradation data conversion unit) 411, a coupling operator (coupling operation unit) 412, an accumulative operator (accumulative operation unit) 413, a memory (memory unit) 414, a comparator (comparison unit) 415, and a third converter (third conversion unit) 416.

The gradation data converter 411 may receive an externally supplied first video signal RGB1, and may convert the received first video signal RGB1 into a gradation data voltage. Here, the first video signal RGB1 includes gradation data to be provided to the plurality of pixels PX.

The gradation data converter 411 may include a first converter (first conversion unit) 411*a* and a second converter (second conversion unit) 411*b*.

The first converter 411*a* may convert first gradation data included in the first video signal RGB1 into a first gradation data voltage Vij (i and j are natural numbers of 2 or more). Here, the first gradation data may be a value corresponding to a data signal to be provided to a pixel PXij that is electrically connected to an i-th data line DLi and a j-th scan line SLj.

The second converter 411*b* may convert second gradation data included in the first video signal RGB1 into a second gradation data voltage V(i+1)j. Here, the second gradation data may be a value corresponding to a data signal to be provided to a pixel PX(i+1)j which is electrically connected to an (i+1)-th data line DLi+1 and a j-th scan line SLj.

Here, the pixel PXij and the pixel PX(i+1)j may be adjacent to each other.

The first converter 411*a* and the second converter 411*b* may convert gradation data into a gradation data voltage on the basis of the graph shown in FIG. 6.

That is, the first converter 411*a* may convert the first gradation data into the first gradation data voltage Vij having a voltage value corresponding to the gray value of the first gradation data on the basis of the graph shown in FIG. 6. Further, the second converter 411*b* may convert the second gradation data into the second gradation data voltage V(i+1)j having a voltage value corresponding to the gray value of the second gradation data on the basis of the graph shown in FIG. 6.

Accordingly, in an embodiment, the gradation data converter 411 may include a memory that stores gradation data values corresponding to the gray values of 0 to 255. Here, in an embodiment, the memory may be a look up table (LUT).

Meanwhile, although it is shown in FIG. 5 that the gradation data converter 411 receives the first video signal RGB1 from the outside, the present invention is not limited thereto. In another embodiment, the gradation data converter 411 may also receive the first video signal RGB1 from the memory 414. That is, first, the memory 414 may receive and store the first video signal RGB1 from the outside, and may then provide the stored first video signal RGB1 to the gradation data converter 411.

Referring to FIG. 5 again, the first converter 411*a* may provide the first gradation data voltage Vij to the coupling operator 412. Further, the second converter 411*b* may provide the second gradation data voltage V(i+1)j to the coupling operator 412.

The coupling operator 412 may generate a reference voltage V(i,j) by performing an operation on the first gradation data voltage Vij and the second gradation data voltage V(i+1)j on the basis of a coupling capacitance ratio. For example, the coupling operator 412 may generate a reference voltage V(i,j) by multiplying the first gradation data voltage Vij and the second gradation data voltage V(i+1)j by a coupling capacitance ratio. The coupling capacitance ratio may be changed depending on the arrangement relationship of the pixels. That is, the coupling capacitance ratio may be set in advance through experiments or measurements in consideration of the arrangement relationship of the pixels. Details thereof will be described later.

The method of generating the reference voltage V(i,j) by the coupling operator 412 may be expressed by Equation 1 below.

$$V(i,j) = (1-\alpha) * Vij + \alpha * V(i+1)j \qquad \text{Equation 1}$$

Here, α represents a coupling capacitance ratio of the pixel PXij and the i-th data line DLi. Further, 1-α represents a coupling capacitance ratio of the pixel PXij and the (i+1)-th data line DLi+1.

The coupling operator 412 may provide the reference voltage V(i,j) to the accumulative operator 413 and the comparator 415, respectively.

The method of generating the reference voltage V(i,j) will be described with reference to the first pixel PX1 and the second pixel PX2 by examples.

Referring to FIGS. 1 and 4 to 6, the first converter 411*a* may convert the first gradation data to be provided to the first pixel PX1 into the first gradation data voltage V11. The second converter 411*b* may convert the second gradation data to be provided to the second pixel PX2 into the second gradation data voltage V21. As described above, the first converter 411*a* and the second converter 411*b* may convert the first gradation data and the second gradation data into the first gradation data voltage V11 and the second gradation data voltage V21, respectively, on the basis of the graph shown in FIG. 6.

The first converter 411*a* may provide the first gradation data voltage V11 to the coupling operator 412. Further, the second converter 411*b* may provide the second gradation data voltage V21 to the coupling operator 412.

The coupling operator 412 may generate a reference voltage V(1,1) by performing a predetermined operation on the first gradation data voltage V11 and on the second gradation data voltage V21 on the basis of the coupling capacitance ratio. For example, the coupling operator 412 may generate a reference voltage V(1,1) by multiplying the first gradation data voltage V11 and the second gradation data voltage V21 by the coupling capacitance ratio.

When the total coupling capacitance is set to 1, the coupling capacitance ratio is referred to as a ratio of a coupling capacitance by the first parasitic capacitor Cp1 between the control electrode of the second switching element TR2 and the first data line DL1, and a coupling capacitance by the third capacitor Cp3 between the control electrode of the second switching element TR2 and the second data line DL2.

If the coupling capacitance ratios of a parasitic capacitor Ca and a parasitic capacitor Cb (e.g., see FIGS. 7 and 8) set in advance are 0.45 and 0.55, respectively, the reference voltage V (1,1) may be expressed by Equation 2 below.

$$V(1,1)=0.45*V11+0.55*V21 \qquad \text{Equation 2}$$

Meanwhile, as described above, the coupling capacitance ratio may be changed depending on the arrangement relationship of the pixels. Hereinafter, the coupling capacitance ratio depending on the arrangement structures of the pixels will be described with reference to FIGS. 7 and 8.

Figure 7:
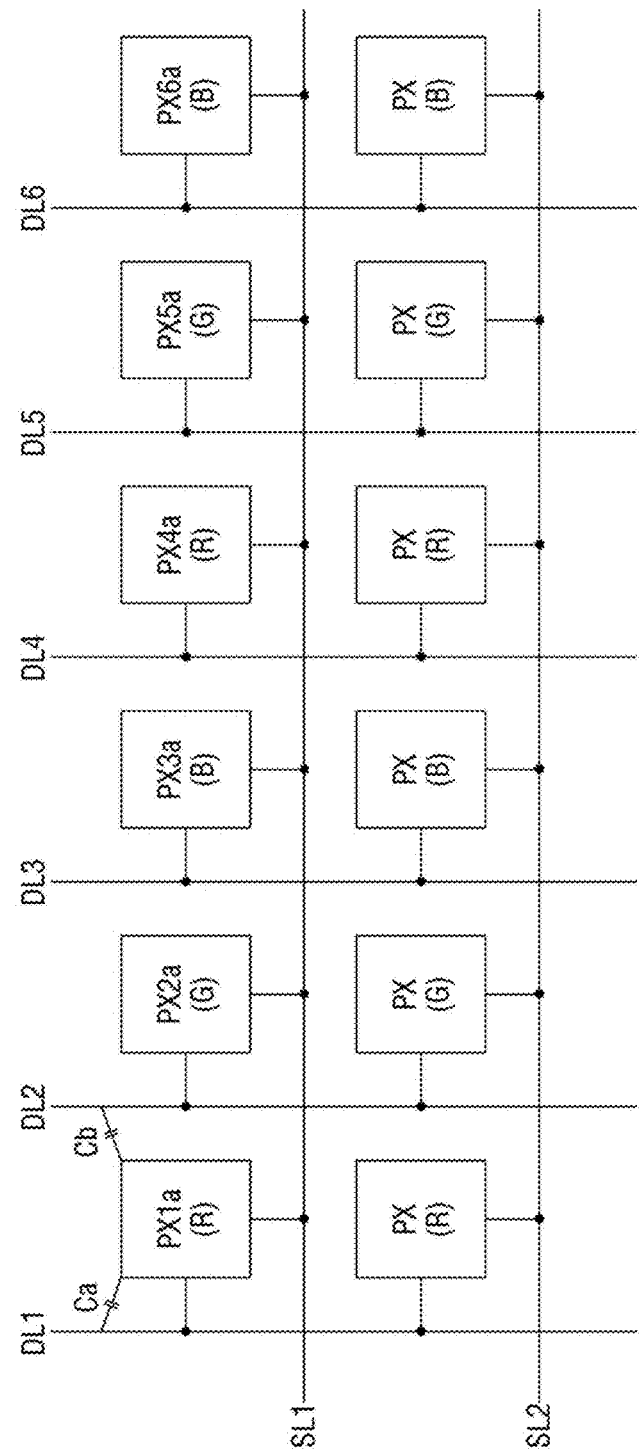
FIG. 7 is a block diagram showing a pixel arrangement structure in the organic light-emitting display device according to an embodiment of the present invention.
Figure 8:
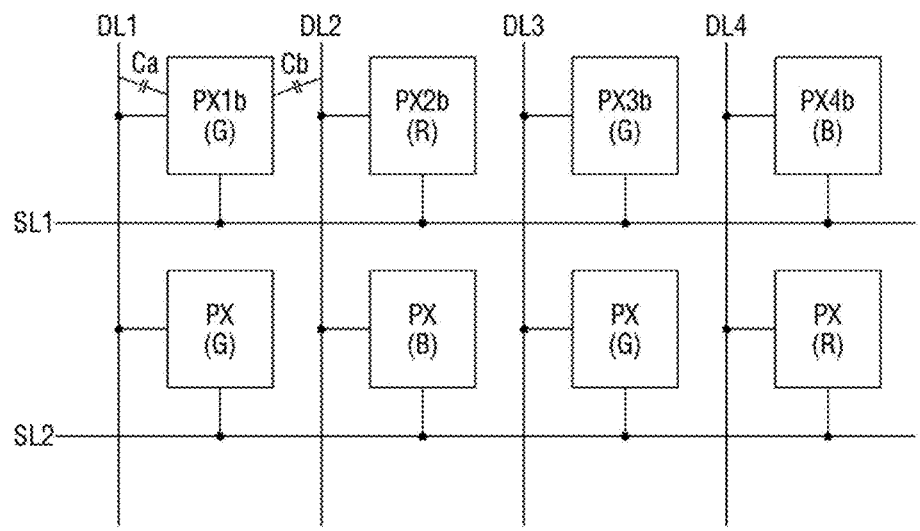
FIG. 8 is a block diagram showing another pixel arrangement structure in the organic light-emitting display device according to an embodiment of the present invention.

FIG. 7 is a block diagram showing a pixel arrangement structure in the organic light-emitting display device according to an embodiment of the present invention. FIG. 8 is a block diagram showing another pixel arrangement structure in the organic light-emitting display device according to an embodiment of the present invention In FIG. 7, the first pixel PX1 and second pixel PX2 described in FIGS. 1 to 6 are represented by PX1a and PX2a, respectively. Further, in FIG. 8, the first pixel PX1 and second pixel PX2 are represented by PX1b and PX2b, respectively.

Here, the first pixels PX1a and PX1b are embodiments of the first pixel PX1 shown in FIG. 1, and the first pixel PX1a shown in FIG. 7 and the first pixel PX1b shown in FIG. 8 are different from each other in display color. Further, the second pixels PX2a and PX2b are embodiments of the second pixel PX2 shown in FIG. 1, and the second pixel PX2a shown in FIG. 7 and the second pixel PX2b shown in FIG. 8 are different from each other in display color.

First, referring to FIG. 7, the first to sixth pixels PX1a to PX6a may be adjacent to each other along the extending direction of the first scan line SL1. The first to sixth pixels PX1a to PX6a may display colors in the order of red, green, and blue, respectively, along the extending direction of the first scan line SL1.

Explaining the first pixel PX1a of FIG. 7 by an example, between the first pixel PX1a and the first data line DL1, the parasitic capacitor Ca may be generated, and between the first pixel PX1a and the second data line DL2, the parasitic capacitor Cb may be generated. The capacitances of the parasitic capacitor Ca and the parasitic capacitor Cb may be different from each other. Accordingly, the coupling capacitance between the first pixel unit PX1a and the first data line DL1 and the coupling capacitance between the first pixel unit PX1a and the second data line DL2 may be different from each other.

Referring to FIG. 8, the first to fourth pixels PX1b to PX4b may be adjacent to each other along the extending direction of the first scan line SL1. The first to fourth pixels PX1b to PX4b may display colors in the order of green, red, green, and blue, respectively, along the extending direction of the first scan line SL1. That is, the first to fourth pixels PX1b to PX4b may be arranged in a pentile form of RGBG.

Explaining the first pixel PX1b of FIG. 8 by an example, between the first pixel PX1b and the first data line DL1, the parasitic capacitor Ca may be generated, and between the first pixel PX1b and the second data line DL2, the parasitic capacitor Cb may be generated. The capacitances of the parasitic capacitor Ca and the parasitic capacitor Cb may be different from each other. Accordingly, the coupling capacitance between the first pixel PX1b and the first data line DL1, and the coupling capacitance between the first pixel PX1b and the second data line DL2, may be different from each other.

Meanwhile, because the arrangement relationships and display colors of the plurality of pixels PX arranged in FIGS. 7 and 8 are different, the coupling capacitances of the parasitic capacitors Ca and Cb of FIG. 7 and of the parasitic capacitors Ca and Cb of FIG. 8 may be different from each other. Therefore, the coupling capacitances between the first pixel PX1a and the first and second data lines DL1 and DL2 in FIG. 7 may be different from the coupling capacitances between the first pixel PX1b and the first and second data lines DL1 and DL2 in FIG. 8.

That is, as described above, the coupling capacitance ratio may be changed depending on the arrangement relationship of the pixels. Thus, the coupling capacitance ratio may be set in advance through experiments or measurements in consideration of the arrangement relationship of the pixels.

The method of generating the first compensation voltage V_DIFF1 using the reference voltage V(i,j) and an average voltage Vave(i) will be described again with reference to FIG. 5.

The accumulative operator 413 may add the reference voltage V(i,j) provided from the coupling operator 412 to a value accumulated before the reference voltage V(i,j) is provided. For this purpose, the accumulative operator 413 may include a line buffer.

As described above, the reference voltage V(i,j) is calculated based on the pixel PXij electrically connected to the i-th data line DLi and the j-th scan line SLj. Therefore, the value accumulated until the reference voltage V(i,j) is provided is a value obtained by accumulating the respective reference voltages from the reference voltage V(i,1) of the pixel PXi1 electrically connected to the i-th data line DLi and the first scan line SL1 to the reference voltage V(i,(j−1)) of the pixel PXi(j−1) electrically connected to the i-th data line DLi and the (j−1)-th scan line SLj−1.

If j is less than n, after the reference voltage V(i,j) is added to the value accumulated before the reference voltage V(i,j) is provided, the reference voltage V(i,(j+1)) of the pixel PXi(j+1), which is electrically connected to the (j+1)-th scan line SLj+1, to the reference voltage V(i,n) of the pixel PXin, which is electrically connected to the n-th scan line SLn, may be additionally accumulated and added.

In contrast, if j is n (that is, when the j-th scan line SLj is the n-th scan line SLn among the first to n-th scan lines SLn), the value obtained by adding the reference voltage V(i,j) to the value accumulated before the reference voltage V(i,j) is provided corresponds to a total sum of the reference voltages of the plurality of pixels connected with the i-th data line DLi during one frame. Hereinafter, in the i-th data line DLi, the value obtained by accumulating and adding the reference voltages during one frame will be expressed by accumulated voltage V_SUM(n).

The accumulative operator 413 may calculate the average voltage Vave(i) in the i—the data line DLi by dividing an accumulated voltage V_SUM(n) of the i-th data line DLi by the number of scan lines (that is, by n). The accumulative operator 413 may provide the average voltage Vave(i) to the memory 414.

The memory 414 may store the average voltage Vave (i) of the i-th data line DLi in the corresponding frame. Further, the memory 414 may provide the average voltage Vave(i) of the i-th data line DLi to the comparator 415.

Meanwhile, the memory 414 may store the average voltage Vave(i) of the i-th data line DLi up to the previous frame for each frame. For this purpose, in an embodiment, the memory 414 may be implemented as a line memory. The accumulative operator 413 may include the memory 414.

The comparator 415 may compare the average voltage Vave(i) in the i-th data line DLi with the reference voltage V(i,j). For example, the comparator 415 may generate the first compensation voltage V_DIFF1 by calculating the difference between the average voltage Vave(i) in the i-th data line DLi and the reference voltage V(i,j). The voltage level difference between the average voltage Vave(i) in the i-th data line DLi and the reference voltage V(i,j) corresponds to a voltage level of the first compensation voltage V_DIFF1.

If the reference voltage V(i,j) is the same as the average voltage Vave(i) of the i-th data line DLi, vertical crosstalk due to coupling does not occur. In contrast, if the reference voltage V(i,j) is different from the average voltage Vave(i) of the i-th data line DLi, vertical crosstalk due to coupling occurs. Therefore, it is necessary to compensate for the difference between the average voltage Vave(i) of the i-th data line DLi and the reference voltage V(i,j) during one frame.

The method of calculating the first compensation voltage V_DIFF1 through the accumulative operator 413, the memory 414, and the comparator 415 may be expressed by Equation 3 below.

$$V\_DIFF1 = \frac{1}{N} * \left\{ \left( \sum_{j=1}^{n} V(i, j) \right) - V(i, j) \right\} = \frac{1}{N} * \{Vave(i) - V(i, j)\} \quad \text{Equation 3}$$

The third converter 416 may receive the first video signal RGB1 from the outside. Further, the third converter 416 may receive the first compensation voltage V_DIFF1 from the comparator 415.

The third converter 416 may receive the first video signal RGB1, and may convert the first video signal RGB1 into a gradation data voltage corresponding to the first gradation data included in the first video signal RGB1. Next, the third converter 416 may generate a second compensation voltage V_DIFF2 by adding the first compensation voltage V_DIFF1 to the gradation data voltage corresponding to the first gradation data. The third converter 416 may convert the generated second compensation voltage V_DIFF2 into compensatory gradation data corresponding to the second compensation voltage V_DIFF2. The third converter 416 may convert the second compensation voltage V_DIFF2 into compensatory gradation data with reference to the graph of FIG. 6. Next, the third converter 416 may provide a second video signal RGB2 including the compensatory gradation data to the image processor 420 (refer to FIG. 1).

Referring to FIG. 1 again, the image processor 420 may generate image data DATA based on the second video signal RGB2 received from the data compensation unit 410 (e.g., from the third converter 416). The image processor 420 may provide the generated image data DATA to the data driver 300.

That is, the organic light-emitting display device may generate a compensation voltage to compensate for the coupling between the pixel and the data line electrically connected thereto, and to compensate for the coupling between the pixel and the adjacent data line. Based on this, the organic light-emitting display device according to the present embodiment can improve vertical crosstalk, and can reduce or prevent change of the luminance of the display unit 100 caused by the coupling phenomenon.

Hereinafter, the improvement of vertical crosstalk will be described in more detail with reference to FIGS. 9 and 10.

Figure 9:
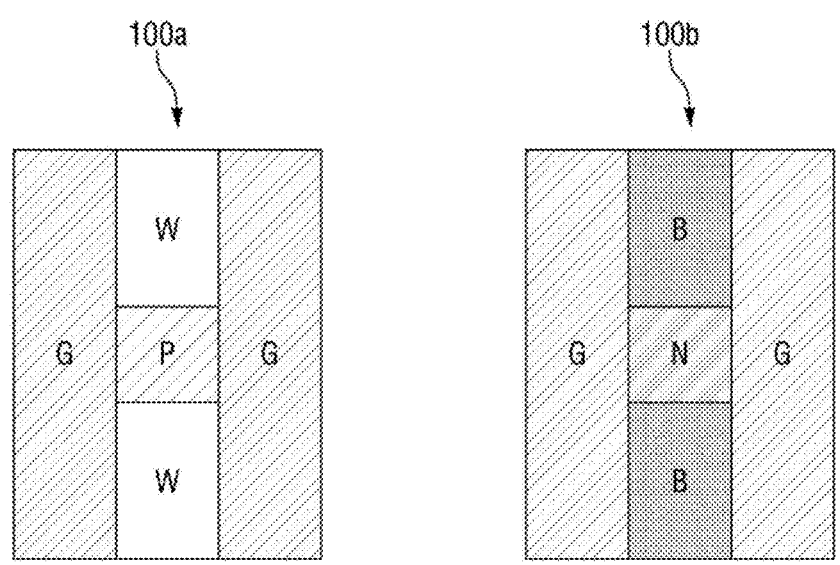
FIGS. 9 and 10 are views for explaining improvement of vertical crosstalk in the organic light-emitting display device according to an embodiment of the present invention.
Figure 10:
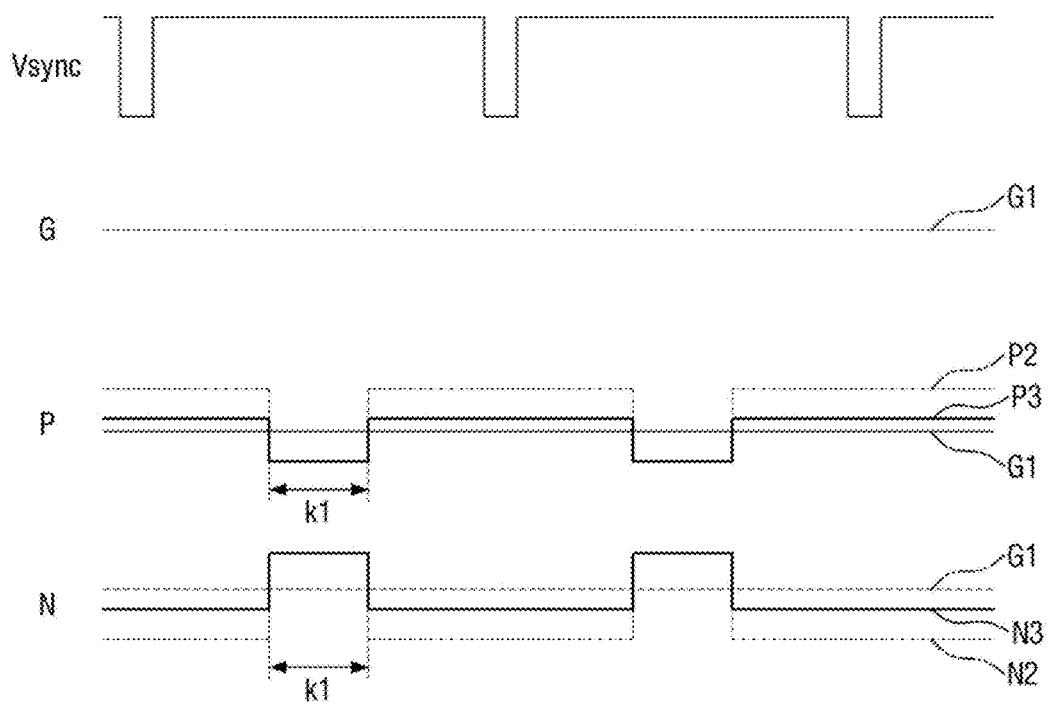

FIGS. 9 and 10 are views for explaining improvement of vertical crosstalk in the organic light-emitting display device according to an embodiment of the present invention.

FIG. 9 shows a display unit 100a having a gray display region G, a white display region W, and a first region P, and also shows a display unit 100b having a gray display region G, a black display region B, and a second region N. Here, the first region P and the second region N are gray display regions, but correspond to regions where display colors are changed due to coupling with adjacent regions.

For example, the first region P of FIG. 9 is a region where a display color is brightened by the coupling with the white display region W in the same column as the first region P, compared to the gray display region G.

Further, the second region N of FIG. 9 is a region where a display color is darkened by the coupling with the black display region B in the same column as the first region P, compared to the gray display region G.

FIG. 10 is a view showing the luminance of the first region P, the second region N, and the gray display region G for each frame. Here, one frame is defined as a section in which a vertical initiation signal Vsync is at a high level. In FIG. 10, the reference numerals P2 and N2 represent luminance in each of the regions P and N before data compensation is performed (that is, before the vertical crosstalk is improved). In FIG. 10, the reference numerals P3 and N3 represent luminance in each of the regions P and N after data compensation is performed (that is, after the vertical crosstalk is improved).

The first region P and the second region N are regions each provided with a data signal corresponding to the same luminance as the gray display region G (hereinafter referred to as reference luminance G1).

The white display region W is in the same column as the first region P. Therefore, when the data signal is provided to the white display region W, vertical crosstalk may occur in the first region P due to the coupling by the data signal.

That is, the luminance of the first region P before the data compensation is performed may be higher than the reference luminance G1 due to the vertical crosstalk, with the exception of a first section k1. That is, the first region P my emit light at second luminance P2, which is higher than the reference luminance G1, except for the first section k1. Here, the first section k1 of one frame is a section in which the data signal corresponding to the reference luminance G1 is provided to the first region P and the second region N.

In contrast, when the compensation of the coupling voltage is performed by the above-described compensation voltage, the first region P may emit light at third luminance P3, which is lower than the second luminance P2. That is, the luminance of the first region P may be made closer to the originally intended reference luminance G1. As a result, it is possible to improve the luminance difference between the first region P and the gray display region G.

The black display region B is in the same column as the second region N. Therefore, when the data signal is provided to the black display region B, in the second region N, vertical crosstalk may occur due to the coupling by the data signal.

That is, the luminance of the second region N before the data compensation is performed may be lower than the reference luminance G1 due to the vertical crosstalk, except for the first section k1. That is, the second region N my emit light at a second luminance N2, which is lower than the reference luminance G1, except for the first section k1.

In contrast, when the compensation of the coupling voltage is performed by the above-described compensation voltage, the second region N may emit light at third luminance N3, which is higher than the second luminance N2. That is, the luminance of the second region N may be made closer to the originally intended reference luminance G1. As a result, it is possible to improve the luminance difference between the second region N and the gray display region G.

Figure 11:
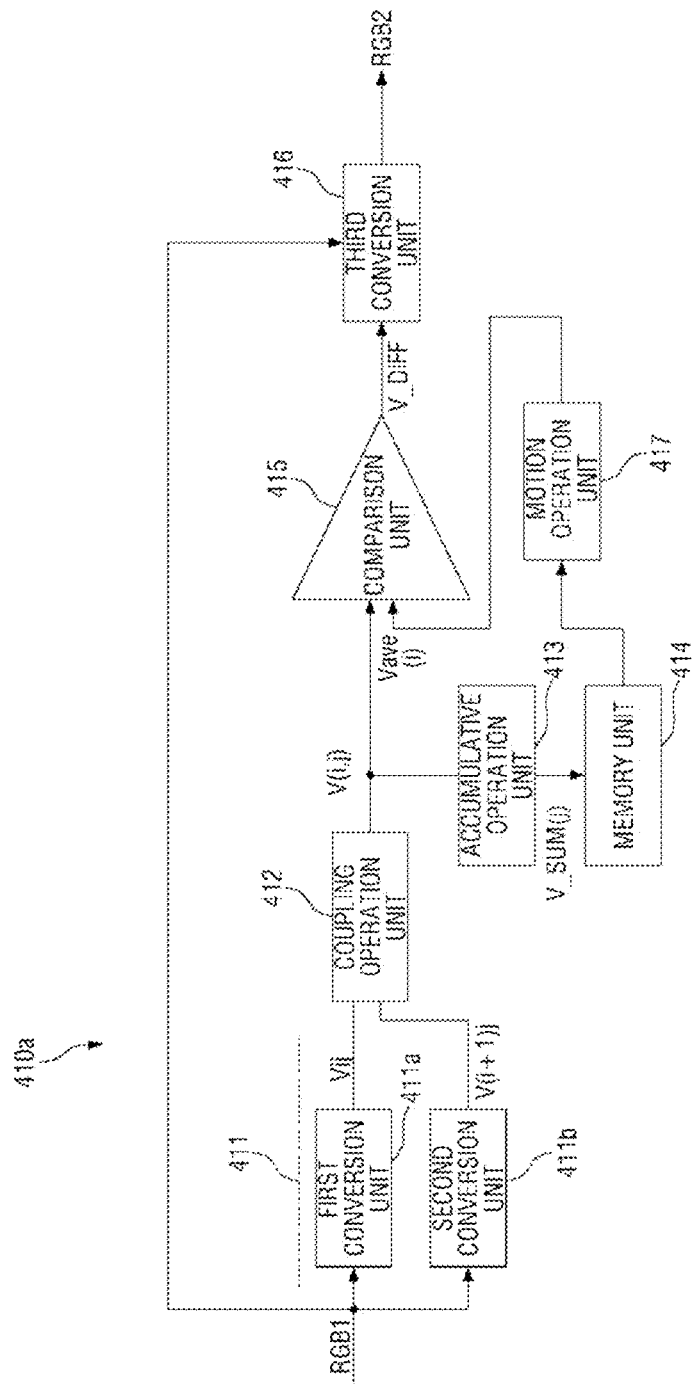
FIG. 11 is a block diagram schematically showing another embodiment of the data compensator shown in FIG. 1.

FIG. 11 is a block diagram schematically showing another embodiment of the data compensator shown in FIG. 1. However, a description overlapping contents having already been described with reference to FIGS. 1 to 10 will be omitted.

Referring to FIG. 11, the data compensator 410a may further include a motion operator (motion operation unit) 417.

The accumulative operator 413 may provide the average voltage Vave(i) in the (k−2)-th frame (k is a natural number of 3 or more), the average voltage Vave(i) in the (k−1)-th frame, the reference voltage V(i,j) of the pixel PXij in the k-th frame, and the accumulated voltage V_SUM(j) accumulated and added from the reference voltage V(i,1) of the pixel PXi1 in the k-th frame to the reference voltage V(i,j) to the memory 414.

The motion operator 417 may receive the average voltage Vave(i) in the (k−2)-th frame (k is a natural number of 3 or more), the average voltage Vave(i) in the (k−1)-th frame, the reference voltage V(i,j) of the pixel PXij in the k-th frame, and the accumulated voltage V_SUM(j) accumulated and added from the reference voltage V(i,1) of the pixel PXi1 in the k-th frame to the reference voltage V(i,j) in the k-th frame.

The motion operator 417 may compare the average voltage Vave(i) in the (k−2)-th frame stored in the memory 414 with the average voltage Vave(i) in the (k−1)-th frame stored in the memory 414. Accordingly, the motion operator 417 may determine whether the display image is a still image or a moving image. Here, the still image means that the display image of the previous frame is the same as that of the corresponding frame. Further, the moving image means that the display image of the previous frame and the display image of the corresponding frame are different from each other, that is, the position or size of an object in the display image is changed.

For example, if the average voltage Vave(i) in the (k−2)-th frame and the average voltage Vave(i) in the (k−1)-th frame are the same as each other, the motion operator 417 may determine that the display image is a still image. In contrast, if the average voltage Vave(i) in the (k−2)-th frame and the average voltage Vave(i) in the (k−1)-th frame are different from each other, the motion operator 417 may determine that the display image is a moving image.

If the display image is a still image, the motion operator 417 may provide the average voltage Vave(i) in the k-th frame to the comparator 415. In contrast, if the display image is a moving image, the motion operator 417 may calculate an average voltage Vave(i') in the k-th frame using the average voltage Vave(i) in the k-th frame and the accumulated voltage V_SUM(j).

For example, the motion operator 417 may calculate the average voltage Vave(i') in the k-th frame using the accumulated voltage V_SUM(j) obtained by accumulating reference voltages from the first scan line SL1 to the j-th scan line SLj in the k-th frame, and using the value obtained by multiplying the average voltage Vave(i') in the k-th frame by n−j (e.g., the total number n of the scan lines less the number j corresponding to the j-th scan line SLj).

That is, in the k-th frame, all of the reference voltages $(\Sigma_{j=1}{}^{n}(V(i,j)))$ from the first scan line SL1 to the n-th scan line SLn are not accumulated. Only the reference voltages $(\Sigma_{y=1}{}^{j}(V(i,y)))$ from the first scan line SL1 to the j-th scan line SLj, and the remaining reference voltages from the (j+1)-th scan line SLj+1 to the n-th scan line SLn may be replaced by the value obtained by multiplying the average voltage Vave(i) in the (k−1)-th frame by n−j.

This may be expressed by Equation 4 below.

$$Kth, \quad Vave(i) = [\left\{\frac{1}{N} * \left(\sum_{y=1}^{j} V(i, y)\right)\right\} + \{(n-j)*k-1th, Vave(i)\}] \qquad \text{Equation 4}$$

Here, kth, Vave(i) means an average voltage Vave(i) in the k-th frame, and k−1th voltage Vave(i) means an average voltage in the (k−1)-th frame.

The motion operator 417 may provide the average voltage Vave(i) in the k-th frame, calculated by Equation 4 above to the comparator 415.

The method of calculating a first compensation voltage V_DIFF1' through the accumulative operator 413, the memory 414, the comparator 415, and the motion operator 417 may be expressed by Equation 5 below.

$$V\_DIFF1' = \frac{1}{N} * \{Kth, Vave(i) - V(i, j)\} \qquad \text{Equation 5}$$

Figure 12:
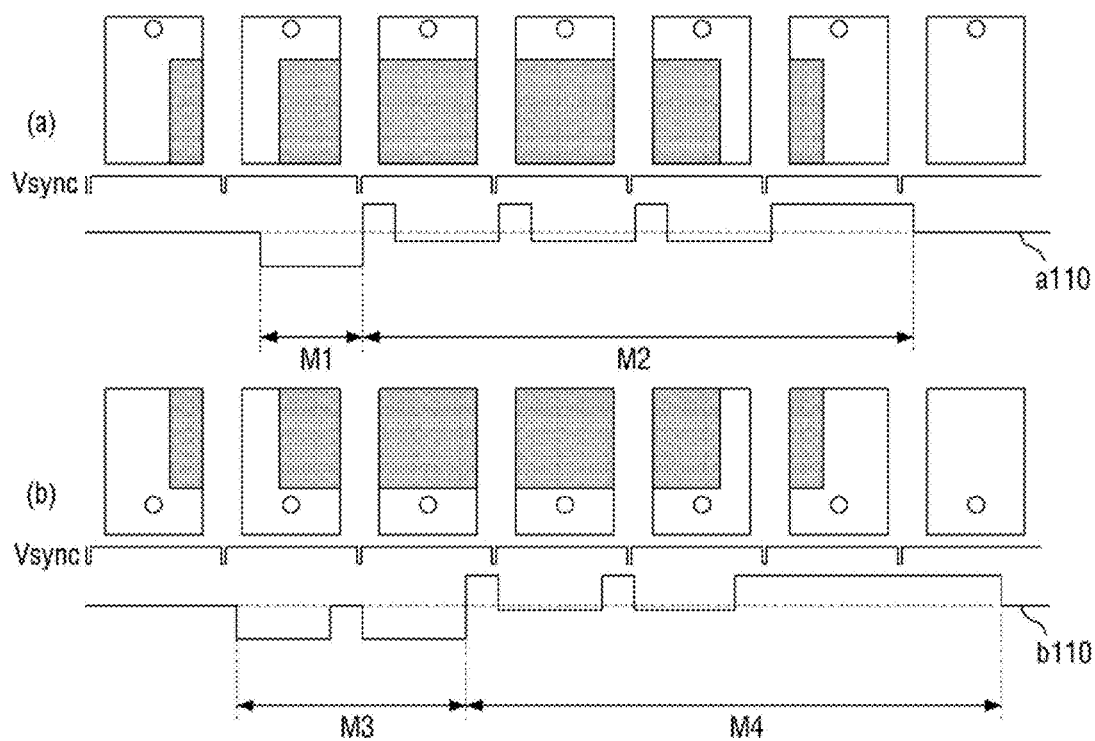
FIG. 12 is a diagram for explaining vertical crosstalk in an organic light-emitting display device according to a comparative embodiment.
Figure 13:
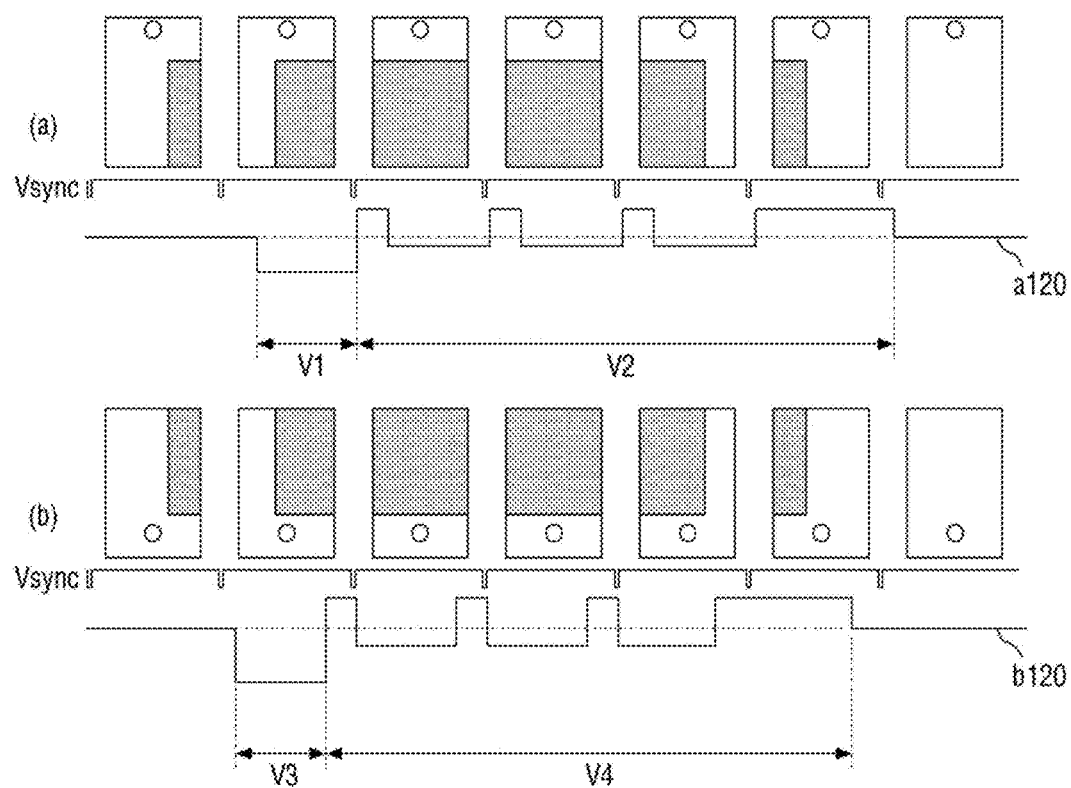
FIG. 13 is a diagram for explaining improvement of vertical crosstalk in the organic light-emitting display device to which the data compensator shown in FIG. 11 is applied.

FIG. 12 is a diagram for explaining vertical crosstalk in an organic light-emitting display device according to a comparative embodiment. FIG. 13 is a diagram for explaining improvement of vertical crosstalk in the organic light-emitting display device to which the data compensator shown in FIG. 11 is applied.

Each of FIGS. 12(a) and 13(a) is an example of the case where the position of a region including an object O is at the upper end of the display unit. Each of FIGS. 12(b) and 13(b) is an example of the case where the position of a region including an object O is the lower end of the display unit.

The organic light-emitting display device according to a comparative embodiment will be first described with reference to FIG. 12. The M1 section of FIG. 12(a) means a section before the compensation is performed by the coupling, and the M2 section of FIG. 12(a) means a section where the compensation is performed by the coupling. Further, the M3 section of FIG. 12(b) means a section before the compensation is performed by the coupling, and the M4 section of FIG. 12(b) means a section where the compensation is performed by the coupling.

In the case of the M1 section of FIG. 12(a), when a region displaying black is moved, the luminance a110 of the region including an object may be lower than target luminance by the coupling of the region including an object and the region displaying black.

Further, in the case of the M3 section of FIG. 12(b), when a region displaying black is moved, the luminance b110 of the region including an object may be lower than target luminance by the coupling of the region including an object and the region displaying black.

In the case of the M2 section of FIG. 12(a), the luminance a110 of the region including an object O may be corrected to be close to target luminance by compensating for the coupling of the region including an object and the region displaying black.

In the case of the M4 section of FIG. 12(b), the luminance b110 of the region including an object O may be corrected to be close to target luminance by compensating for the coupling of the region including an object and the region displaying black.

However, as compared with the case of FIG. 12(a), the case of FIG. 12(b) is later in the timing of performing the compensation.

In the case where the position of the region including an object O is at the lower end of the display unit (refer to FIG. 12(b)), a compensation delay exists, the compensation delay being defined as the time until compensation is performed, as compared with the case where the position of the region including an object O is the upper end of the display unit (refer to FIG. 12(a)). For example, in the case of FIG. 12(b), it can be seen that the compensation is performed after at least two frames, after the deterioration of luminance due to the coupling occurs.

An organic light-emitting display device according to another embodiment of the present invention will be descried with reference to FIG. 13.

The V1 section of FIG. 13(a) means a section before the compensation is performed by the coupling, and the V2 section of FIG. 13(a) means a section where the compensation is performed by the coupling. Further, the V3 section of FIG. 13(b) means a section before the compensation is performed by the coupling, and the V4 section of FIG. 13(b) means a section where the compensation is performed by the coupling.

In the case of FIG. 13(b), it can be seen that the time at which compensation is performed is the same as that in the case of FIG. 13(a). That is, in both cases of FIG. 13(a) and FIG. 13(b), compensation is performed in the same frame. This means that the compensation delay has been removed.

That is, the organic light-emitting display device according to another embodiment of the present invention may remove a compensation delay of up to two frames by calculating the average voltage Vave(i') in the k-th frame using the accumulated voltage V_SUM(j) obtained by accumulating reference voltages from the first scan line SL1 to the j-th scan line SLj in the k-th frame and the value obtained by multiplying the average voltage Vave(i') in the k-th frame by n-j.

Figure 14:
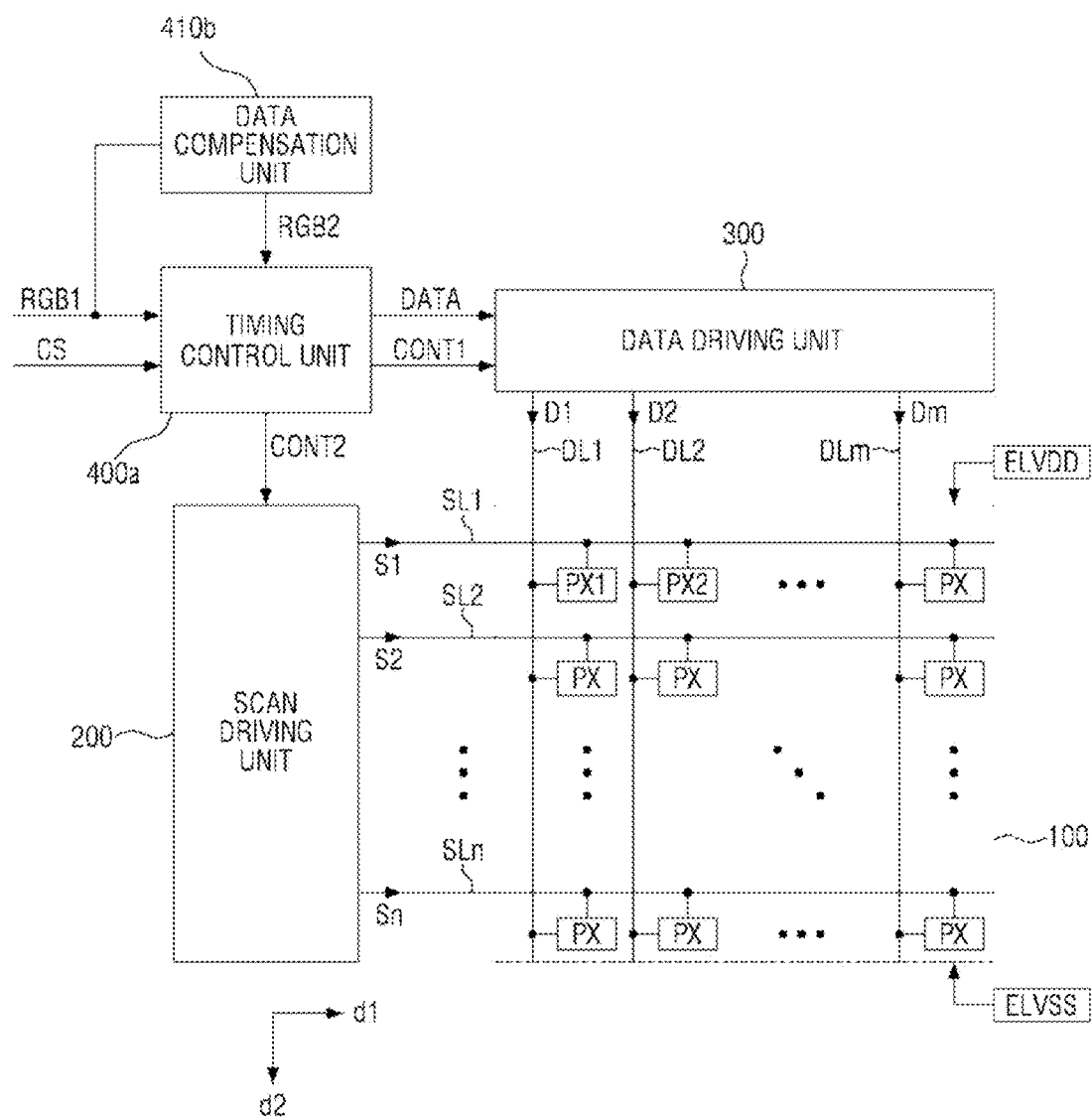
FIG. 14 is a schematic block diagram of an organic light-emitting display device according to another embodiment of the present invention.

FIG. 14 is a schematic block diagram of an organic light-emitting display device according to another embodiment of the present invention. However, a description overlapping descriptions already described with respect to FIGS. 1 to 13 will be omitted.

Referring to FIG. 14, a data compensator 410b may be located outside a timing controller 400a, rather than being provided in the timing controller 400a. Accordingly, the timing controller 400a may receive a second video signal RGB2 from the data compensator 410b located outside the timing controller 400a.

Hereinafter, another embodiment for calculating the reference voltage V(i,j) will be described.

The reference voltage V(i,j) may be calculated for all of the plurality of pixels PX in the display unit 110.

In another embodiment, the reference voltage V(i,j) may be calculated for a pixel displaying at least one color of red, green, and blue among the plurality of pixels in the display unit. For example, when the reference voltage V(i,j) is calculated for a pixel displaying a green color among the plurality of pixels, the compensation voltage based on the calculated reference voltage V(i,j) may be applied to pixels displaying the remaining colors. Thus, the size of the memory 414 can be reduced.

Hereinafter, another embodiment for calculating the average voltage Vave(i) will be described.

Referring to FIG. 5, when the average voltage Vave (i) is calculated, there is no need to divide the accumulated voltage V_SUM (n) of the i-th data line DLi by the total number of scan lines (that is, by the number n). The accumulative calculation may be performed on odd-numbered or even-numbered scan lines among the first to n-th scan lines SL1 to SLn. This may be expressed by Equation 6 below.

$$V\_DIFF1'' = \frac{1}{N} * \left\{ \left( \sum_{j=1}^{\frac{n}{2}} V(i, j) \right) - V(i, j) \right\}$$ [Equation 6]

Accordingly, the number of times of accessing the line buffer of the accumulative operation unit 413 can be reduced, and power consumption can be reduced.

As described above, according to the embodiments of the present invention, it is possible to compensate for a luminance difference due to vertical crosstalk.

The effects of the present invention are not limited by the foregoing, and other various effects are anticipated herein.

Although the preferred embodiments of the present invention have been disclosed for illustrative purposes, those skilled in the art will appreciate that various modifications, additions and substitutions are possible, without departing from the scope and spirit of the invention as disclosed in the accompanying claims and their functional equivalents.

What is claimed is:

1. An organic light-emitting display device, comprising a plurality of pixels comprising first to n-th pixels (n is a natural number of 2 or more) electrically connected with a first data line extending in a second direction, and a data compensator for generating a reference voltage of a k-th pixel of the pixels (k being a natural number of 1 or more, and of n or less) based on a first coupling voltage between the k-th pixel and the first data line and based on a second coupling voltage between the k-th pixel and a second data line adjacent to the first data line in a first direction crossing the second direction, and for comparing an average voltage generated based on a reference voltage of at least one of the first to n-th pixels with the reference voltage of the k-th pixel to generate a compensation signal, wherein the reference voltage of at least one of the first to n-th pixels is generated based on a coupling voltage between the at least one of the first to n-th pixels and the first data line and based on a coupling voltage between the at least one of the first to n-th pixels and the second data line.

2. The organic light-emitting display device of claim 1, wherein the data compensator is also for determining a voltage level of the compensation signal based on a voltage difference between the reference voltage of the k-th pixel and the average voltage.

3. The organic light-emitting display device of claim 1, wherein the data compensator is also for generating the average voltage by dividing an accumulated voltage obtained by adding reference voltages of the first to n-th pixels by n.

4. The organic light-emitting display device of claim 1, wherein the data compensator is for generating the compensation signal based on a reference voltage of a pixel displaying a first color among the plurality of pixels, and
wherein the data compensator is for using the compensation signal for a pixel displaying a second color that is different from the first color.

5. The organic light-emitting display device of claim 1, wherein the data compensator is for generating the average voltage by dividing an accumulated voltage obtained by adding reference voltages of odd-numbered or even-numbered pixels among the first to n-th pixels by a number of the added reference voltages.

6. The organic light-emitting display device of claim 1, wherein the data compensator comprises:
a gradation data converter for:
receiving a first video signal comprising first gradation data provided to the k-th pixel, and second gradation data provided to a pixel of the pixels that is adjacent to the k-th pixel in the first direction;
converting the first gradation data into a first gradation data voltage; and
converting the second gradation data into a second gradation data voltage;
a coupling operator for generating the reference voltage of the k-th pixel based on the first and second gradation data voltages and based on a ratio of the first and second coupling voltages; and
an accumulative operator for generating the average voltage based on the reference voltage of at least one pixel among the first to n-th pixels.

7. The organic light-emitting display device of claim 6, wherein the accumulative operator is for adding the reference voltage of the k-th pixel to an accumulated voltage obtained by adding reference voltages of the first pixel to a (k−1)-th pixel.

8. The organic light-emitting display device of claim 7, wherein the accumulative operator comprises a memory for storing reference voltages of the first pixel to a (k−1)-th pixel.

9. The organic light-emitting display device of claim 8, wherein the memory is for storing an average voltage in a first frame, an average voltage in a second frame subsequent to the first frame, and an accumulated voltage obtained by adding the reference voltages of the first pixel to the (k−1)-th pixel in a third frame subsequent to the second frame.

10. The organic light-emitting display device of claim 9, wherein the data compensator comprises a motion operator for comparing the average voltage in the first frame with the average voltage in the second frame.

11. The organic light-emitting display device of claim 10, wherein the motion operator is for generating an average voltage in the third frame based on the average voltage in the second frame and the accumulated voltage.

12. An organic light-emitting display device, comprising a plurality of pixels comprising a first pixel electrically connected with a first data line, and a second pixel electrically connected with a second data line that is adjacent to the first data line in a first direction, and
a data compensator for generating a reference voltage of the first pixel based on a first coupling voltage between the first pixel and the first data line, for generating a second coupling voltage between the first pixel and the second data line, and for comparing an average voltage generated based on a reference voltage of at least one pixel of the pixels electrically connected with the first data line with the reference voltage of the first pixel to generate a compensation signal.

13. The organic light-emitting display device of claim 12, wherein the data compensator is for determining a voltage level of the compensation signal based on a voltage difference between the reference voltage of the first pixel and the average voltage.

14. The organic light-emitting display device of claim 12, wherein the data compensator comprises:
a gradation data converter for:
receiving a first video signal comprising first gradation data provided to the first pixel, and second gradation data provided to the second pixel;
converting the first gradation data into a first gradation data voltage; and
converting the second gradation data into a second gradation data voltage;
a coupling operator for generating the reference voltage of the first pixel based on the first and second gradation data voltages and based on a ratio of the first and second coupling voltages; and
an accumulative operator for generating the average voltage based on an accumulated voltage obtained by adding reference voltages of one or more pixels.

15. The organic light-emitting display device of claim 14, wherein the accumulative operator comprises a memory for storing the average voltage.

16. A method of driving an organic light-emitting display device comprising a plurality of pixels comprising first to n-th pixels (n being a natural number of 2 or more) that are electrically connected with a first data line, the method comprising:
generating a reference voltage of a k-th pixel (k being a natural number of 1 or more and n or less) among the first to n-th pixels based on a first coupling voltage between the k-th pixel and the first data line, and based on a second coupling voltage between the k-th pixel and a second data line that is adjacent to the first data line in a second direction;
generating an average voltage based on a first accumulated voltage obtained by adding the reference voltages of the first pixel to the k-th pixel; and
generating a compensation signal by comparing the reference voltage of the k-th pixel with the average voltage.

17. The method of claim 16, wherein a voltage level of the compensation signal is set based on a voltage difference between the reference voltage of the k-th pixel and the average voltage.

18. The method of claim 16, wherein the step of generating the average voltage comprises:
adding the reference voltage of the k-th pixel to the first accumulated voltage to generate a second accumulated voltage;
adding reference voltages of the (k+1)-th pixel to the n-th pixel to the second accumulated voltage to generate a third accumulated voltage; and
dividing the third accumulated voltage by n to generate the average voltage.

19. The method of claim 16, wherein generating the reference voltage of the k-th pixel comprises:
receiving a first video signal comprising first gradation data provided to the k-th pixel, and second gradation data provided to a pixel adjacent to the k-th pixel in the second direction among the plurality of pixels;

converting the first gradation data into a first gradation data voltage;

converting the second gradation data into a second gradation data voltage; and generating the reference voltage of the k-th pixel based on the first and second gradation data voltages and based on a ratio of the first and second coupling voltages.

20. The method of claim 16, further comprising storing the generated average voltage in a memory.

* * * * *